US009030388B2

(12) United States Patent
Qi et al.

(10) Patent No.: US 9,030,388 B2
(45) Date of Patent: May 12, 2015

(54) PIXEL CIRCUIT AND DRIVING METHOD THEREOF

(71) Applicants: Boe Technology Group Co., Ltd., Beijing (CN); Chengdu Boe Optoelectronics Technology Co., Ltd., Chengdu, Sichuan (CN)

(72) Inventors: Xiaojing Qi, Beijing (CN); Quanguo Zhou, Beijing (CN); Yun Qiu, Beijing (CN)

(73) Assignees: Boe Technology Group Co., Ltd., Beijing (CN); Chengdu Boe Optoelectronics Technology Co., Ltd., Chengdu, Sichuan (CN)

( * ) Notice: Subject to any disclaimer, the term of this patent is extended or adjusted under 35 U.S.C. 154(b) by 0 days.

(21) Appl. No.: 13/996,152

(22) PCT Filed: Dec. 17, 2012

(86) PCT No.: PCT/CN2012/086799
§ 371 (c)(1),
(2) Date: Jun. 20, 2013

(87) PCT Pub. No.: WO2013/104236
PCT Pub. Date: Jul. 18, 2013

(65) Prior Publication Data
US 2014/0070725 A1    Mar. 13, 2014

(51) Int. Cl.
*G09G 3/30* (2006.01)
*H01L 27/32* (2006.01)
G09G 3/32 (2006.01)
*H05B 33/08* (2006.01)

(52) U.S. Cl.
CPC .......... *H01L 27/3262* (2013.01); *G09G 3/3233* (2013.01); *G09G 2300/0861* (2013.01); *H05B 33/0896* (2013.01)

(58) Field of Classification Search
USPC .................. 315/169.3; 345/76, 77, 82, 84, 92
See application file for complete search history.

(56) References Cited

U.S. PATENT DOCUMENTS

| 2006/0244688 | A1 | 11/2006 | Ahn et al. | |
| 2008/0211796 | A1* | 9/2008 | Kim | 345/204 |
| 2008/0315189 | A1* | 12/2008 | Lee et al. | 257/40 |
| 2010/0127955 | A1* | 5/2010 | Choi | 345/76 |
| 2010/0220086 | A1* | 9/2010 | Chung et al. | 345/211 |
| 2010/0253609 | A1* | 10/2010 | Ono et al. | 345/76 |
| 2011/0141160 | A1* | 6/2011 | Nathan et al. | 345/690 |
| 2011/0141164 | A1* | 6/2011 | Kimura et al. | 345/690 |
| 2011/0210990 | A1* | 9/2011 | Kim et al. | 345/690 |
| 2012/0105427 | A1* | 5/2012 | Senda | 345/212 |

FOREIGN PATENT DOCUMENTS

| CN | 1855198 A | 11/2006 |
| CN | 1949342 A | 4/2007 |
| CN | 101281723 A | 10/2008 |
| CN | 101305409 A | 11/2008 |
| CN | 101986378 A | 3/2011 |
| CN | 101996579 A | 3/2011 |
| CN | 102280085 A | 12/2011 |
| CN | 102654976 A | 9/2012 |
| WO | 2011/004646 A1 | 1/2011 |

OTHER PUBLICATIONS

International Search Report mailed Mar. 21, 2013; PCT/CN2012/086799.
First Chinese Office Action dated Dec. 6, 2013; Appln. No. 201210008738.3.
Third Chinese Office Acion dated Sep. 17, 2014; Appln. No. 20121008738.3.
Second Chinese Office Action dateed Jul. 8, 2014; Appl. No. 20120008738.3.
Korean Office Action dated May 21, 2014; Appln. No. 10-2013-7015437.
International Preliminary Report on Patentability dated Jul. 15, 2014; PCT/CN2012/086799.

* cited by examiner

Primary Examiner — Thuy Vinh Tran
Assistant Examiner — Syed M Kaiser
(74) Attorney, Agent, or Firm — Ladas & Parry LLP

(57) ABSTRACT

It discloses a pixel circuit and a driving method thereof. The pixel circuit includes a light-emitting device (OLED), a driving transistor (DTFT), a storage capacitor (Cst), a first switching transistor (T1), a second switching transistor (T2), a compensating transistor (T3) and a fifth switching transistor (T5). The light-emitting device (OLED) has one terminal connected to a power supply (VDD). The driving transistor (DTFT) has a first electrode connected to another terminal of the light-emitting device (OLED), a second electrode connected to a first electrode of the fifth switching transistor (T5), and a gate connected to a first electrode of the first switching transistor (T1). The first switching transistor (T1) has a second electrode connected to a data line, a gate connected to a scan line, and a first electrode connected to the gate of the driving transistor (DTFT). The second switching transistor (T2) has a gate connected to a control line, a first electrode connected to the power supply (VDD), and a second electrode connected to a second electrode of the compensating transistor (T3). The compensating transistor (T3) has a first electrode connected to the first electrode of the driving transistor (DTFT), a second electrode connected to the second electrode of the second switching transistor (T2), and a gate connected to the first or second electrode of the compensating transistor (T3). The fifth switching transistor (T5) has a gate connected to the control line, a first electrode connected to the second electrode of the driving transistor (DTFT), and a second electrode connected to ground (GND). The storage capacitor (Cst) has a first plate connected to the gate of the driving transistor (DTFT), and a second plate connected to the second electrode of the compensating transistor (T3).

13 Claims, 5 Drawing Sheets

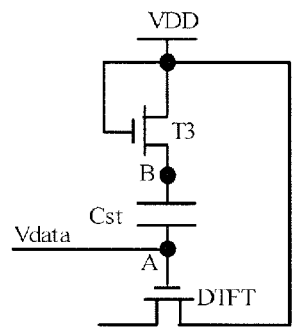

FIG. 9

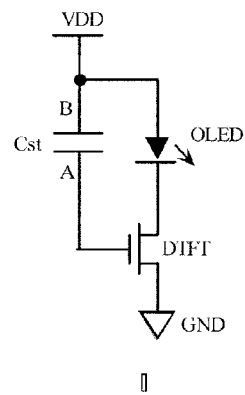

FIG. 10

| turning on the first switching transistor T1 and meanwhile turning off the second switching transistor T2 and the fifth switching transistor T5, so that the data signal Vdata on the data line charges the first plate of the storage capacitor Cst via the first switching transistor T1 and the power supply VDD charges the second plate of the storage capacitor Cst via the light-emitting device OLED and the compensating transistor T3 | S11 |
|---|---|
| turning off the first switching transistor T1 and meanwhile turning on the second switching transistor T2 and the fifth switching transistor T5, so that the light-emitting device OLED is driven to emit light by the current, supplied from the power supply VDD, flowing through the light-emitting device OLED, the driving transistor DTFT and the fifth switching transistor T5 in turn | S12 |

FIG. 11

PIXEL CIRCUIT AND DRIVING METHOD THEREOF

TECHNICAL FIELD OF THE DISCLOSURE

The present disclosure relates to the field of display technology, and particularly relates to a pixel circuit, a driving method thereof, and a display apparatus.

BACKGROUND

Organic Light-Emitting Diode (OLED) is a current-driven active light-emitting device, and has advantages of self illumination, rapid response, wide view angle, and capable of being manufactured on a flexible substrate, etc. It can be predicted that Organic light-emitting display based on OLEDs will be popular in the field of display. Each display unit of the organic light-emitting display includes an OLED, and the OLED can be divided into Passive Matrix Driving OLED (PMOLED) and Active Matrix Driving OLED (AMOLED) according to the manner in which OLED is driven. Active Matrix Driving OLED (AMOLED) is widely used in the display with large amount of information due to its high display quality. In AMOLED, for each OLED, a current flowing through the OLED is controlled by a Thin Film Transistor (TFT) circuit, and the OLED and the TFT circuit for driving the OLED constitute a pixel circuit. Therefore, in order to ensure evenness of the luminance of an Active Organic Light-Emitting display panel, it is necessary for the characteristics of TFTs located in different regions of a back board for driving OLEDs to be consistent.

A threshold voltage of a TFT depends on many factors including doping of a first electrode of the TFT, thickness of dielectric medium in the TFT, material of a gate of the TFT and excess charges in the dielectric medium in the TFT. At present, during the manufacturing process of a back board, particularly a back board with large size, it is difficult to achieve the consistence in such factors due to the limitation of the process condition and level, so that drifts in threshold voltages of respective TFTs are not consistent. In addition, the drifts in the threshold voltages of respective TFTs will be inconsistent due to the decrease of TFT stability caused by a long time operation. The variance of the drifts in the threshold voltages of respective TFTs then cause variance of the currents flowing through the respective TFTs, and thus the evenness of the luminance of OLEDs driven by these currents deteriorates.

SUMMARY

Embodiments of the present disclosure provide a pixel circuit, a driving method thereof, and a display apparatus capable of improving the evenness of the luminance of a light-emitting device effectively.

According to one aspect of the present disclosure, there is provided a pixel circuit including: a light-emitting device, a driving transistor, a storage capacitor, a first switching transistor, a second switching transistor, a compensating transistor and a fifth switching transistor, wherein each of the driving transistor, the first switching transistor, the second switching transistor, the compensating transistor and the fifth switching transistor includes a gate, a first electrode and a second electrode;

one terminal of the light-emitting device is connected to a power supply;

the first electrode of the driving transistor is connected to another terminal of the light-emitting device, the second electrode of the driving transistor is connected to the first electrode of the fifth switching transistor, and the gate of the driving transistor is connected to the first electrode of the first switching transistor;

the second electrode of the first switching transistor is connected to a data line, the gate of the first switching transistor is connected to a scan line, and the first electrode of the first switching transistor is connected to the gate of the driving transistor;

the gate of the second switching transistor is connected to a control line, the first electrode of the second switching transistor is connected to the power supply, and the second electrode of the second switching transistor is connected to the second electrode of the compensating transistor;

the first electrode of the compensating transistor is connected to the first electrode of the driving transistor, the second electrode of the compensating transistor is connected to the second electrode of the second switching transistor, and the gate of the compensating transistor is connected to the first or second electrode of the compensating transistor;

the gate of the fifth switching transistor is connected to the control line, the first electrode of the fifth switching transistor is connected to the second electrode of the driving transistor, and the second electrode of the fifth switching transistor is connected to ground; and a first plate of the storage capacitor is connected to the gate of the driving transistor, and a second plate of the storage capacitor is connected to the second electrode of the compensating transistor.

According to another aspect of the present disclosure, there is provided a driving method of the pixel circuit, including:

turning on the first switching transistor and meanwhile turning off the second switching transistor and the fifth switching transistor, so that the data signal on the data line charges the first plate of the storage capacitor via the first switching transistor and the power supply charges the second plate of the storage capacitor via the light-emitting device and the compensating transistor; and turning off the first switching transistor and meanwhile turning on the second switching transistor and the fifth switching transistor, so that the light-emitting device is driven to emit light by the current, supplied from the power supply, flowing through the light-emitting device, the driving transistor and the fifth switching transistor in turn.

According to another aspect of the present disclosure, there is provided a display apparatus including the pixel circuit provided in embodiments of the present disclosure.

In the pixel circuit, the driving method of the pixel circuit, and the display apparatus provided in the embodiments of the present disclosure, the switching and charging/discharging process of the pixel circuit are controlled by the compensating transistor, the storage capacitor and a plurality of switching transistors, so that the voltage across the two terminals of the compensating transistor acts upon the driving transistor and thus the driving current of the driving transistor is independent of the threshold voltage of the driving transistor, which compensates the variation in the current flowing through the light-emitting device caused by inconsistence or drift of the threshold voltage of the driving transistor, which can effectively increase the evenness of the luminance of the light-emitting device.

BRIEF DESCRIPTION OF THE DRAWINGS

In order to describe the technical solutions of embodiments of the present disclosure or the prior art, accompanying drawings used in the descriptions of the embodiments of the present disclosure or the prior art will be briefly explained below. It is obvious that the accompanying drawings described below are merely a part of embodiments of the present disclosure but not all of embodiments of the present disclosure. Other drawings can also be obtained by those skilled in the art based on the teachings of these drawings without paying any creative labor.

FIG. 9 is a schematic equivalent circuit diagram of the pixel circuit shown in FIG. 8 in a compensating stage;

FIG. 10 is a schematic equivalent circuit diagram of the pixel circuit shown in FIG. 8 in a stage for switching to light emission; and FIG. 11 is a flow chart of a driving method for the pixel circuits provided in an embodiment of the present disclosure.

DETAILED DESCRIPTION

Below, the technical solutions of embodiments of the present disclosure will be described clearly and fully taken in conjunction of accompanying drawings of the embodiments of the present disclosure. Obviously, the embodiments described are merely a part of embodiments of the present disclosure but not all of embodiments of the present disclosure. All other embodiments obtained by those skilled in the art based on the teachings of the embodiments of the present disclosure without paying any creative labor should fall within the scope claimed by the present disclosure.

Figure 1:
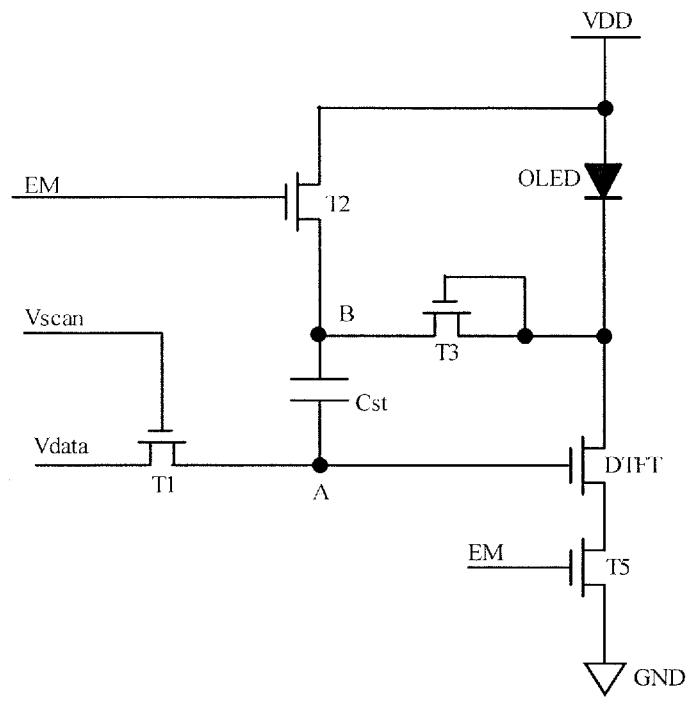
FIG. 1 is a circuit diagram of a pixel circuit provided in an embodiment of the present disclosure.

As shown in FIG. 1, in an embodiment of the present disclosure, there is provided a pixel circuit, including: a light-emitting device OLED, a driving transistor DTFT, a storage capacitor Cst, a first switching transistor T1, a second switching transistor T2, a compensating transistor T3 and a fifth switching transistor T5.

The driving transistor DTFT, the first switching transistor T1, the second switching transistor T2, the compensating transistor T3 and the fifth switching transistor T5 are N-type Thin Film Transistors (TFTs), each of which includes a source, a drain and a gate.

One terminal of the light-emitting device OLED is connected to a power supply VDD;

the drain (a first electrode) of the driving transistor DTFT is connected to another terminal of the light-emitting device OLED, the source (a second electrode) of the driving transistor DTFT is connected to the drain (a first electrode) of the fifth switching transistor T5, and the gate of the driving transistor DTFT is connected to the drain (a first electrode) of the first switching transistor T1;

the source (a second electrode) of the first switching transistor T1 is connected to a data line, the gate of the first switching transistor T1 is connected to a scan line, and the drain (the first electrode) of the first switching transistor T1 is connected to the gate of the driving transistor DTFT;

the gate of the second switching transistor T2 is connected to a control line, the drain (a first electrode) of the second switching transistor T2 is connected to the power supply VDD, and the source (a second electrode) of the second switching transistor T2 is connected to the source (a second electrode) of the compensating transistor T3;

the gate and the drain (a first electrode) of the compensating transistor T3 are connected to each other, and the drain (the first electrode) of the compensating transistor T3 is connected to the drain (the first electrode) of the driving transistor DTFT, and the source (the second electrode) of the compensating transistor T3 is connected to the source (the second electrode) of the second switching transistor T2;

the gate of the fifth switching transistor T5 is connected to the control line, the drain (the first electrode) of the fifth switching transistor T5 is connected to the source (the second electrode) of the driving transistor DTFT, and the source (a second electrode) of the fifth switching transistor DTFT is connected to ground;

a first plate of the storage capacitor Cst is connected to the gate of the driving transistor DTFT, and a second plate of the storage capacitor Cst is connected to the source (the second electrode) of the compensating transistor T3.

It should be noted that, in the present embodiment, the compensating transistor T3 is equivalent to a diode, and the drain (the first electrode) and the gate of the compensating transistor T3 are connected to each other to be equivalent to a positive electrode of the diode and connected to the drain (the first electrode) of the driving transistor DTFT, and the source (the second electrode) of the compensating transistor T3 is equivalent to a negative electrode of the diode and connected to the source (the second electrode) of the second switching transistor T2.

It should be noted that, in the present embodiment, different signals are transmitted on the scan line, the control line and the data line, respectively, wherein a scan signal Vscan is transmitted on the scan line, a control signal EM is transmitted on the control line, and a data signal Vdata is transmitted on the data line.

Figure 2:
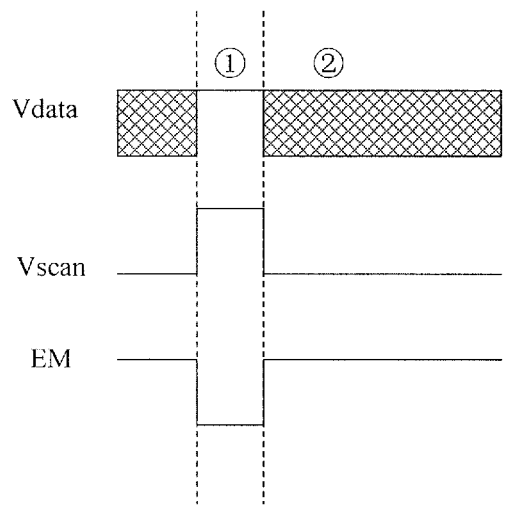
FIG. 2 is a timing sequence diagram of respective signal lines when the pixel circuit shown in FIG. 1 drives the light-emitting device.

Below, the operation process of the pixel circuit shown in FIG. 1 will be described in detail with reference to FIGS. 2-4. When driving, the operation of the pixel circuit shown in FIG. 1 can be divided into two driving stages: a compensating stage and a stage for switching to light emission. FIG. 2 shows a timing sequence diagram of respective signal lines when the pixel circuit shown in FIG. 1 drives the light-emitting device OLED. As shown in FIG. 2, the compensating stage and the stage for switching to light emission are denoted by ①, and ②, respectively. A driving method of the pixel circuit shown in FIG. 1 is as follows:

A First Stage: Compensating Stage in the compensating stage, the scan signal Vscan is at a high level and the control signal EM is at a low level. The first switching transistor T1 is turned on since the input scan signal Vscan is at the high level, and the second switching transistor T2 and the fifth switching transistor T5 are turned off since the control signal EM is at the low level. The compensating transistor T3 is in a forward conductive state in the compensating stage. At this time, the pixel circuit shown in FIG. 1 may be equivalent to the circuit structure shown in FIG. 3.

Figure 3:
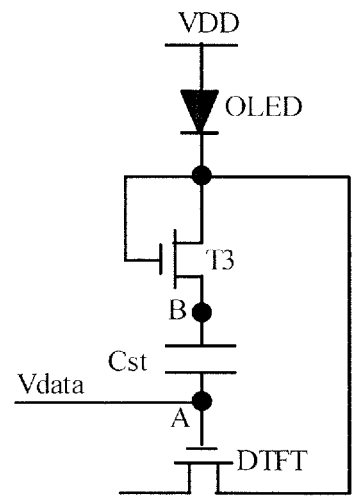
FIG. 3 is a schematic equivalent circuit diagram of the pixel circuit shown in FIG. 1 in a compensating stage.

Combining FIG. 1 and FIG. 3, in the compensating stage, the data signal Vdata may input to the gate of the driving transistor DTFT via the first switching transistor T1, and thus charge the storage capacitor Cst so that the data signal Vdata input to the gate of the driving transistor DTFT is maintained, since the first switching transistor T1 is turned on. After the completion of the charging, a voltage VA at point A equals to the data signal Vdata, $$\text{that is, } VA=Vdata \quad (1)$$

a voltage VB at point B equals to a value obtained by subtracting a threshold voltage Voth of the light-emitting device OLED and a threshold voltage Vth3 of the compensating transistor T3 from the power supply voltage VDD, $$\text{that is, } VB=VDD-Voth-Vth3 \quad (2)$$

so, a voltage across the two plates of the storage capacitor Cst is:

$$\begin{aligned} VAB &= VA - VB \\ &= Vdata - (VDD - Voth - Vth3) \\ &= Vdata - VDD + Voth + Vth3 \end{aligned} \quad (3)$$

Meanwhile, the storage capacitor Cst and the power supply VDD are disconnected since the second switching transistor T2 is turned off due to the low level of the control signal EM input to the gate of the second switching transistor T2, which makes sure that the light-emitting device OLED and the compensating transistor T3 are forward conductive. Moreover, the driving transistor DTFT and the ground GND are disconnected since the fifth switching transistor T5 is turned off due to the low level of the control signal EM input to the gate of the fifth switching transistor T5, which avoids the loss of the data signal Vdata input to the gate of the driving transistor DTFT via the connection between the fifth switching transistor T5 and the ground GND.

A Second Stage: A Stage for Switching to Light Emission in the stage for switching to light emission, the scan signal Vscan is at a low level and the control signal EM is at a high level. The first switching transistor T1 is turned off since the input scan signal Vscan is at the low level, and the second switching transistor T2 and the fifth switching transistor T5 are turned on since the control signal EM is at the high level. The compensating transistor T3 is in a reverse blocking state in the stage for switching to light emission. At this time, the pixel circuit shown in FIG. 1 may be equivalent to the circuit structure shown in FIG. 4.

Figure 4:
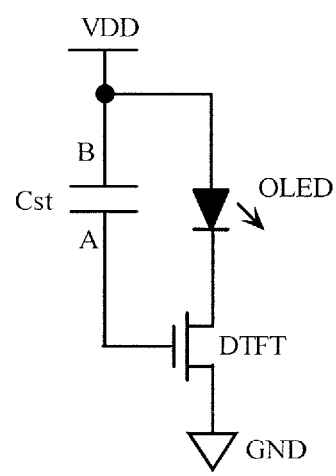
FIG. 4 is a schematic equivalent circuit diagram of the pixel circuit shown in FIG. 1 in a stage for switching to light emission.

Combining FIG. 1 and FIG. 4, the first switching transistor T1 is turned off since the scan signal Vscan input to the gate of the first switching transistor T1 is at the low level, so that the gate of the driving transistor DTFT and the data line are separated from each other, and thus the driving transistor DTFT drives the light-emitting device OLED without being affected by the variation of the data signal Vdata input to the source of the first switching transistor T1.

Meanwhile, the upper plate of the storage capacitor Cst is directly connected to the power supply VDD since the second switching transistor T2 is turned on due to the high level of the control signal EM input to the gate of the second switching transistor T2, which makes the voltage VB at point B change to the VDD instantaneously. It can be known from principles of the physics, the voltage across the two plates of the storage capacitor Cst cannot change instantaneously, and thus, in the stage for switching to light emission, the above equation (3) still stands when the voltage VB at point B just jumps to the VDD. So, the voltage VA at point A equals to a sum of the voltage VB at point B and the voltage VAB across point A and point B, that is, $$\begin{aligned} VA &= VB - VAB \\ &= VDD + (Vdata - VDD + Voth + Vth3) \\ &= Vdata + Voth + Vth3 \end{aligned} \quad (4)$$

Meanwhile, the source of the driving transistor DTFT is directly connected to the ground GND since the fifth switching transistor T5 is turned on due to the high level of the control signal EM input to the gate of the fifth switching transistor T5. At this time, the driving transistor DTFT operates in a saturation state, and thus a current I flowing through the source and the drain of the driving transistor DTFT (i.e., a driving current I for driving the light-emitting device OLED to emit light) varies as the variation of the voltage Vgs between the gate and the source of the driving transistor DTFT and the detailed relationship is represented by the following equation (5). The driving transistor DTFT begins to drive the light-emitting device OLED to emit light.

$$I=K(Vgs-Vth)^2 \quad (5)$$

wherein, Vgs is a gate-source voltage of the driving transistor DTFT, in the present embodiment, $$Vgs=VA-0=Vdata+Voth+Vth3 \quad (6)$$

$K=\mu_{eff}*Cox*(W/L)/2$, wherein $\mu_{eff}$ is representative of effective carrier mobility of DTFT, Cox is representative of gate insulating layer dielectric constant thereof, W/L is representative of channel width-length ratio of the driving transistor DTFT, wherein W is representative of channel width, L is representative of channel length. K can be considered as a constant due to the relative stability of the values of W, L, Cox and $\mu_{eff}$ in a same structure.

After substituting the equation (6) into the equation (5), in the present embodiment, the current flowing through the driving transistor DTFT is:

$$I=K(Vdata+Voth+Vth3-Vth)^2 \quad (7)$$

It can be known from the equation (7) that the current I flowing through the driving transistor DTFT has a relation with the threshold voltage Vth3 of the compensating transistor T3, the threshold voltage Vth of the driving transistor DTFT and the threshold voltage Voth of the light-emitting device OLED, in addition to with the data signal Vdata and the constant K. According to principles of short range order of the Low Temperature Poly-silicon (LIPS) process, TFTs in a short range can be considered as uniform, that is, characteristics of TFTs being in close distance and with a same structure are almost the same. Thus, for example, in the present embodiment, locations of the compensating transistor T3 and the driving transistor DTFT are close and can be considered as in a short range, so the threshold voltage Vth3 of the compensating transistor T3 and the threshold voltage Vth of the driving transistor DTFT are almost the same, that is, Vth3−Vth=0. Accordingly, according to the equation (7), the current I flowing through the driving transistor DTFT is:

$$I=K(Vdata+Voth)^2 \quad (8)$$

that is, the current I flowing through the driving transistor DTFT merely has a relation with the data signal Vdata and the threshold voltage Voth of the light-emitting device OLED.

As such, in the pixel circuit provided in the embodiment of the present disclosure, on one hand, the driving current I is independent of the threshold voltage Vth of the driving transistor DTFT, which avoids the current variation in the driving current I (i.e., current flowing through the light-emitting device OLED) caused by drift of the threshold voltage of the driving transistor DIET due to manufacturing process of the back-board or long-time operation thereof, which effectively increases the evenness of the luminance of the light-emitting device OLED.

On the other hand, according to the equation (8), the pixel circuit provided in the embodiment of the present disclosure can compensate not only the variation of the driving current I caused by the drift of the threshold voltage Vth of the driving transistor DTFT, but also the variation of the current flowing through the light-emitting device OLED caused by the higher or lower of the threshold voltage Voth of the light-emitting device OLED since the driving current I has a relation with the threshold voltage Voth of the light-emitting device OLED, which further increases the evenness of the luminance of the light-emitting device OLED. The reasons are as follows, according to the equation (8), in the pixel circuit provided in the embodiment of the present disclosure, the driving current I will increase as the threshold voltage Voth of the light-emitting device OLED increases and decrease as the threshold voltage Voth of the light-emitting device OLED decreases, so when the threshold voltage Voth increases due to the aging of the OLED, the driving current I will increase accordingly, so as to compensate the reduction in the driving current I caused by increase of the threshold voltage Voth of the light-emitting device OLED.

It should be noted that, in the present embodiment, in the compensating stage, the light-emitting device OLED is in a charging circuit loop of the storage capacitor Cst although the light-emitting device OLED is not driven to emit light by the driving transistor DTFT, and thus OLED will emit light to a certain extent when the data signal Vdata is input to the gate of the driving transistor DTFT and charges the storage capacitor Cst.

In the above embodiment, the driving transistor DTFT, the compensating transistor T3 and the respective switching transistors are N-type TFTs, but the present disclosure is not limited thereto. Part or all of the above respective N-type TFTs may be substituted by P-type TFTs, if only the following conditions are satisfied.

A first condition of the compensating transistor T3 and the driving transistor DTFT being of a same type, that is, both of them being N-type TFTs or P-type TFTs, shall be satisfied. Since the compensating transistor T3 is used for providing a compensation voltage to make the driving current I of the driving transistor DTFT independent of the threshold voltage Vth of the driving transistor DTFT, and it is necessary for a compensating voltage Vth3 provided by the compensating transistor T3 being equal to the threshold voltage Vth of the driving transistor DTFT. Such an effect can be achieved by ensuring that the compensating transistor T3 and the driving transistor DTFT are in close distance and with the same structure and thus the short range order condition of LIPS process is met.

A second condition of the second switching transistor T2 and the fifth switching transistor T5 being of a same type, that is, both of them being N-type TFTs or P-type TFTs, shall be satisfied. It is necessary for the second switching transistor T2 and the fifth switching transistor T5 being turned on or off simultaneously, which is controlled by the control signal EM on the control line.

It should be noted that the conditions for a P-type TFT and for an N-type TFT being turned on or off are different, when N-type TFTs in the above embodiment are substituted by P-type TFTs, in order to ensure the functions of the pixel circuit being performed normally, corresponding adjustments are necessary for signals input to gates of the respective TFTs, such as the scan signal Vscan input to the gate of the first switching transistor T1, the control signal EM input to the gates of the second switching transistor T2 and the fifth switching transistor T5, and the data signal Vdata input to the gate of the driving transistor DTFT. Description will be given in detail by particular embodiments.

Figure 5:
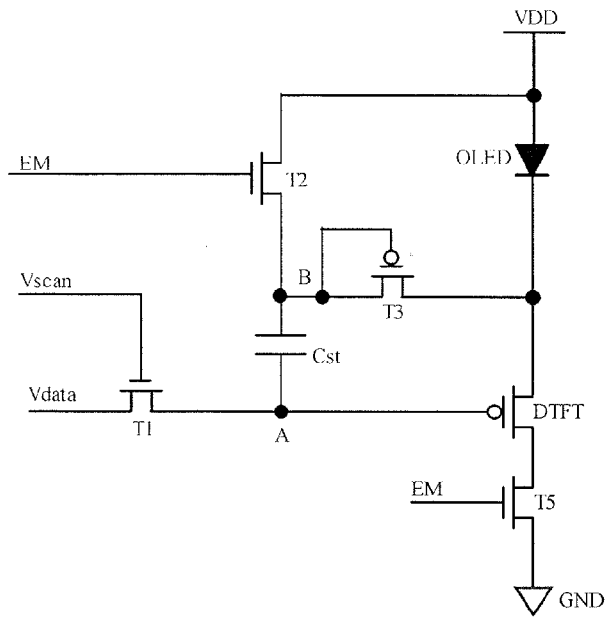
FIG. 5 is a circuit diagram of another pixel circuit provided in an embodiment of the present disclosure.

As shown in FIG. 5, in another embodiment of the present disclosure, the pixel circuit includes: a light-emitting device OLED, a driving transistor DTFT, a storage capacitor Cst, a first switching transistor T1, a second switching transistor T2, a compensating transistor T3 and a fifth switching transistor T5.

The driving transistor DTFT and the compensating transistor T3 are P-type Thin Film Transistors (TFTs), the first switching transistor T1, the second switching transistor T2 and the fifth switching transistor T5 are N-type TFTs, each TFT includes a source, a drain and a gate.

One terminal of the light-emitting device OLED is connected to a power supply VDD;

the source (a first electrode) of the driving transistor DTFT is connected to another terminal of the light-emitting device OLED, the drain (a second electrode) of the driving transistor DTFT is connected to the drain (a first electrode) of the fifth switching transistor T5, and the gate of the driving transistor DTFT is connected to the drain (a first electrode) of the first switching transistor T1;

the source (a second electrode) of the first switching transistor T1 is connected to a data line, the gate of the first switching transistor T1 is connected to a scan line, and the drain (the first electrode) of the first switching transistor T1 is connected to the gate of the driving transistor DTFT;

the gate of the second switching transistor T2 is connected to a control line, the drain (a first electrode) of the second switching transistor T2 is connected to the power supply VDD, and the source (a second electrode) of the second switching transistor T2 is connected to the drain (a second electrode) of the compensating transistor T3;

the gate and the drain (the second electrode) of the compensating transistor T3 are connected to each other, and the source (a first electrode) of the compensating transistor T3 is connected to the source (the first electrode) of the driving transistor DTFT, and the drain (the second electrode) of the compensating transistor T3 is connected to the source (the second electrode) of the second switching transistor T2;

the gate of the fifth switching transistor T5 is connected to the control line, the drain (the first electrode) of the fifth switching transistor T5 is connected to the drain (the second electrode) of the driving transistor DTFT, and the source (a second electrode) of the fifth switching transistor T5 is connected to ground;

a first plate of the storage capacitor Cst is connected to the gate of the driving transistor DTFT, and a second plate of the storage capacitor Cst is connected to the drain (the second electrode) of the compensating transistor T3.

Compared to the embodiment shown in FIG. 1, only the driving transistor DTFT and the compensating transistor T3 are different from those in the embodiment shown in FIG. 1, and accordingly data signal Vdata input to the gate of the driving transistor DTFT is different from that in the embodiment shown in FIG. 1.

In the embodiment shown in FIG. 1, the driving transistor DTFT is an N-type TFT and the current I flowing through the source and the drain of the N-type driving transistor DTFT increases as the data signal Vdata rises and decreases as the data signal Vdata falls. In the present embodiment, the driving transistor DTFT is a P-type TFT and the current I flowing through the source and the drain of the P-type driving transistor DTFT decreases as the data signal Vdata rises and increases as the data signal Vdata falls. Therefore, as for a same current I flowing through the driving transistor DTFT, the data signal Vdata in the embodiment shown in FIG. 1 and that in the present embodiment can be different.

It should be noted that, except the above differences, other parts of the pixel circuit in the present embodiment have the same structure as those shown in FIG. 1, and repeated descriptions will not be given.

The pixel circuit provided in the present embodiment can achieve the same technical effect as the embodiment shown in FIG. 1 as well by substituting the N-type driving transistor DTFT and the N-type compensating transistor T3 in FIG. 1 by the corresponding P-type driving transistor DTFT and the corresponding P-type compensating transistor T3.

Figure 6:
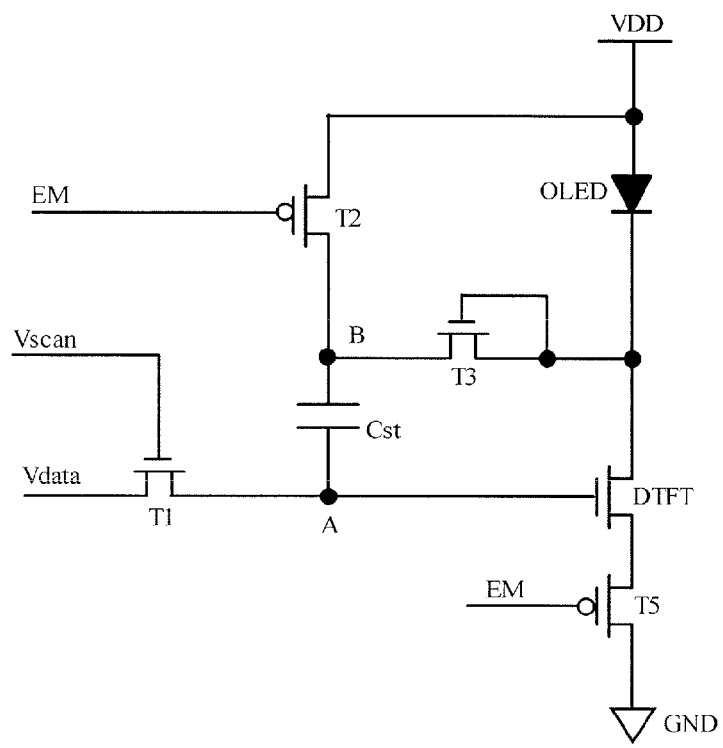
FIG. 6 is a circuit diagram of another pixel circuit provided in an embodiment of the present disclosure.

FIG. 6 shows a circuit diagram of another pixel circuit provided by another embodiment of the present disclosure. As shown in FIG. 6, difference between the present embodiment and the embodiment shown in FIG. 1 lies in that the second switching transistor T2 and the fifth switching transistor T5 are not N-type TFTs but P-type TFTs. Accordingly, the control signal EM input to the gate of the second switching transistor T2 and the gate of the fifth switching transistor T5 is different from that in the embodiment shown in FIG. 1.

Particularly, as shown in FIG. 6, the pixel circuit provided in the present embodiment includes: a light-emitting device OLED, a driving transistor DTFT, a storage capacitor Cst, a first switching transistor T1, a second switching transistor T2, a compensating transistor T3 and a fifth switching transistor T5. The driving transistor DTFT, the first switching transistor T1 and the compensating transistor T3 are N-type Thin Film Transistors (TFTs), the second switching transistor T2 and the fifth switching transistor T5 are P-type TFTs, each TFT includes a source, a drain and a gate.

One terminal of the light-emitting device OLED is connected to a power supply VDD;

the drain (a first electrode) of the driving transistor DTFT is connected to another terminal of the light-emitting device OLED, the source (a second electrode) of the driving transistor DTFT is connected to the source (a first electrode) of the fifth switching transistor T5, and the gate of the driving transistor DTFT is connected to the drain (a first electrode) of the first switching transistor T1;

the source (a second electrode) of the first switching transistor T1 is connected to a data line, the gate of the first switching transistor T1 is connected to a scan line, and the drain (the first electrode) of the first switching transistor T1 is connected to the gate of the driving transistor DTFT;

the gate of the second switching transistor T2 is connected to a control line, the source (a first electrode) of the second switching transistor T2 is connected to the power supply VDD, and the drain (a second electrode) of the second switching transistor T2 is connected to the source (a second electrode) of the compensating transistor T3;

the gate and the drain (a first electrode) of the compensating transistor T3 are connected to each other, and the drain (the first electrode) of the compensating transistor T3 is connected to the drain (the first electrode) of the driving transistor DTFT, and the source (the second electrode) of the compensating transistor T3 is connected to the drain (the second electrode) of the second switching transistor T2;

the gate of the fifth switching transistor T5 is connected to the control line, the source (the first electrode) of the fifth switching transistor T5 is connected to the source (the second electrode) of the driving transistor DTFT, and the drain (a second electrode) of the fifth switching transistor T5 is connected to ground;

a first plate of the storage capacitor Cst is connected to the gate of the driving transistor DTFT, and a second plate of the storage capacitor Cst is connected to the source (the second electrode) of the compensating transistor T3.

The operation process of the pixel circuit of the present embodiment is similar to that of the pixel circuit shown in FIG. 1, except that the manner in which the second switching transistor T2 and the fifth switching transistor T5 are turned on or off under the control of the control signal EM differs from that in the embodiment shown in FIG. 1.

Particularly, one difference between the present embodiment and that shown in FIG. 1 lies in that the second switching transistor T2 and the fifth switching transistor T5 are turned off when the control signal EM is at a high level in a compensating stage in the present embodiment. The operation process of the pixel circuit provided in the present embodiment in the compensating stage is similar to that in the embodiment shown in FIGS. 1-4, and repeated description will be emitted.

Accordingly, another difference between the present embodiment and that shown in FIG. 1 lies in that the second switching transistor T2 and the fifth switching transistor T5 are turned on when the control signal EM is at a low level in a stage for switching to light emission in the present embodiment. The operation process of the pixel circuit provided in the present embodiment in the stage for switching to light emission is similar to that in the embodiment shown in FIGS. 1-4, and repeated description will be emitted.

Figure 7:
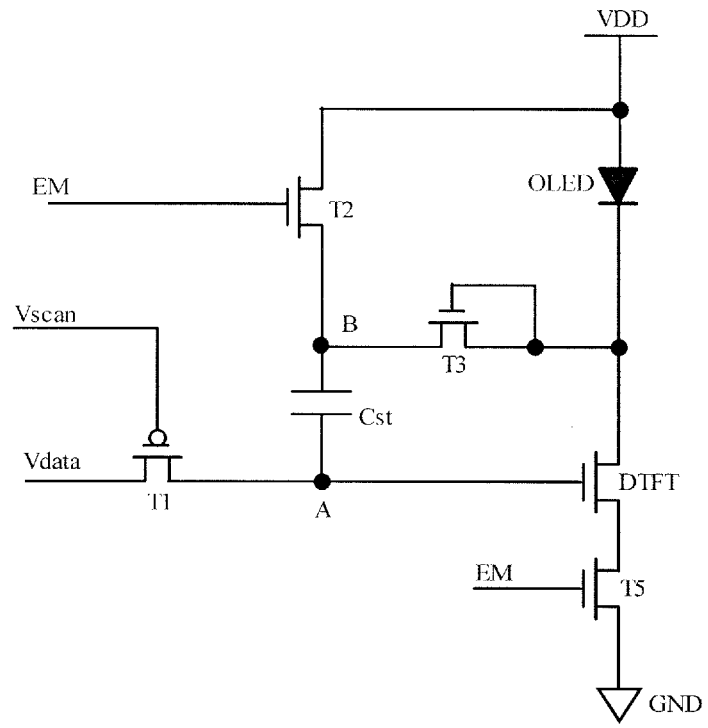
FIG. 7 is a circuit diagram of another pixel circuit provided in the embodiments of the present disclosure.

As shown in FIG. 7, a pixel circuit provided in another embodiment of the present disclosure includes: a light-emitting device OLED, a driving transistor DTFT, a storage capacitor Cst, a first switching transistor T1, a second switching transistor T2, a compensating transistor T3 and a fifth switching transistor T5. The driving transistor DTFT, the second switching transistor T2, the compensating transistor T3 and the fifth switching transistor T5 are N-type Thin Film Transistors (TFTs), and the first switching transistor T1 is a P-type TFT, each TFT includes a source, a drain and a gate.

One terminal of the light-emitting device OLED is connected to a power supply VDD;

the drain (a first electrode) of the driving transistor DTFT is connected to another terminal of the light-emitting device OLED, the source (a second electrode) of the driving transistor DTFT is connected to the drain (a first electrode) of the fifth switching transistor T5, and the gate of the driving transistor DTFT is connected to the source (a first electrode) of the first switching transistor T1;

the drain (a second electrode) of the first switching transistor T1 is connected to a data line, the gate of the first switching transistor T1 is connected to a scan line, and the source (the first electrode) of the first switching transistor T1 is connected to the gate of the driving transistor DTFT;

the gate of the second switching transistor T2 is connected to a control line, the drain (a first electrode) of the second switching transistor T2 is connected to the power supply VDD, and the source (a second electrode) of the second switching transistor T2 is connected to the source (a second electrode) of the compensating transistor T3;

the gate and the drain (a first electrode) of the compensating transistor T3 are connected to each other, and the drain (the first electrode) of the compensating transistor T3 is connected to the drain (the first electrode) of the driving transistor DTFT, and the source (the second electrode) of the compensating transistor T3 is connected to the source (the second electrode) of the second switching transistor T2;

the gate of the fifth switching transistor T5 is connected to the control line, the drain (the first electrode) of the fifth switching transistor T5 is connected to the source (the second electrode) of the driving transistor DTFT, and the source (a second electrode) of the fifth switching transistor T5 is connected to ground;

a first plate of the storage capacitor Cst is connected to the gate of the driving transistor DTFT, and a second plate of the storage capacitor Cst is connected to the source (the second electrode) of the compensating transistor T3.

The operation process of the pixel circuit of the present embodiment is similar to that of the pixel circuit shown in FIG. 1, except that the manner in which the first switching transistor T1 is turned on or off under the control of the scan signal Vscan differs from that in the embodiment shown in FIG. 1.

Particularly, in a compensating stage, the scan signal Vscan is at a low level so that the first switching transistor T1 is turned on. The operation process of the pixel circuit provided in the present embodiment in the compensating stage is similar to that in the embodiment shown in FIGS. 1-4, and repeated description will be emitted.

Particularly, in a stage for switching to light emission, the scan signal Vscan is at a high level so that the first switching transistor T1 is turned off. The operation process of the pixel circuit provided in the present embodiment in the stage for switching to light emission is similar to that in the embodiment shown in FIGS. 1-4, and repeated description will be emitted.

Several cases of pixel circuit are described in detail in the above embodiments of the present disclosure, such as a case wherein respective TFTs are all N-type TFTs, a case wherein the driving transistor DTFT and the compensating transistor T3 are P-type TFTs and other TFTs are N-type TFTs, a case wherein the second switching transistor T2 and the fifth switching transistor T5 are P-type TFTs and other TFTs are N-type TFTs, and a case wherein the first switching transistor T1 is a P-type TFT and other TFTs are N-type TFTs. However, the present disclosure is not limited thereto, and in other embodiments of the present disclosure, the above respective switching transistors, the driving transistor DTFT and the compensating transistor T3 may all be P-type TFTs or be a combination in other forms of part of TFTs being P-type TFTs and other part of TFTs being N-type TFTs, as long as it is ensured that the compensating transistor T3 and the driving transistor DTFT being of a same type, that is, both being N-type TFTs or P-type TFTs, and meanwhile the second switching transistor T2 and the fifth switching transistor T5 being of a same type.

When one or more N-type TFTs in the pixel circuit shown in FIG. 1 are substituted by P-type TFTs, the manner in which the respective P-type TFTs are connected in the pixel circuit is similar to the manner in which the original respective N-type TFTs are connected in the pixel circuit shown in FIG. 1, and can be adjusted according to the corresponding relationships among the voltage potentials of the gates, the drains and the source of P-type TFTs and N-type TFTs on the principles of semiconductor physics. For example, in the embodiment shown in FIG. 1, the respective TFTs are all the N-type TFTs, the first electrodes of the respective TFTs are all the drains and the second electrodes of the respective TFTs are all the sources. In the other embodiments of the present disclosure, when one of TFTs is replaced from the N-type TFT to the P-type TFT, its connection manner can still be described by the connection manner of the first and second electrodes of the corresponding TFTs in the embodiment shown in FIG. 1 except that the source or the drain being represented by which one of the first electrode and the second electrode may differ according to the particular type of the TFT.

In the embodiment shown in FIG. 1, when the TFTs except for the compensating transistor T3 are replaced from N-type TFTs to P-type TFTs, the first electrodes of the P-type TFTs correspond to the sources of the P-type TFTs and the second electrodes of the P-type TFTs correspond to the drains of the P-type TFTs. As for the compensating transistor T3, the gate and the drain thereof are always connected to each other, therefore the gate and the drain (the first electrode) of T3 are connected to each other when T3 is an N-type TFT, and the gate and the drain (the second electrode) of T3 are connected to each other when T3 is a P-type TFT. At this time, the compensating transistor T3 is equivalent to a diode, the drain and the gate thereof are connected to each other to be equivalent to one electrode of the diode, and the source thereof is equivalent to another electrode of the diode. In a particular circuit, the electrodes of the diode can be connected to a high voltage potential or a low voltage potential in the particular circuit according to the requirement for forward bias or reverse bias of the diode.

It should be noted that the structure of the pixel circuit provided in the present embodiment of the present disclosure is similar to that in the embodiment shown in FIG. 1, and the difference therebetween lies in that each of TFTs being an N-type TFT or a P-type TFT may be different. Accordingly, the connection in the circuit will be adjusted adaptively, as long as the functions of the circuit in the compensating stage and the stage for switching to light emission can be achieved normally.

Figure 8:
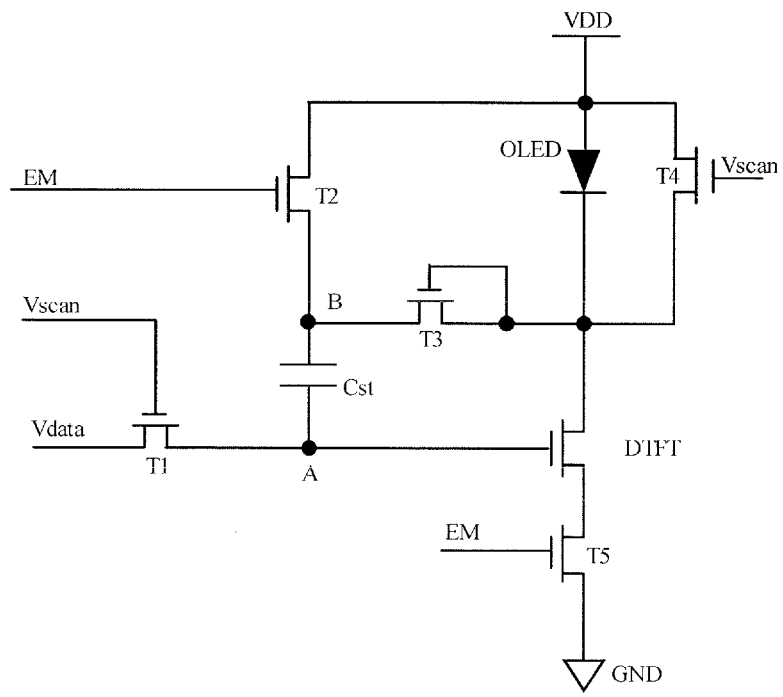
FIG. 8 is a circuit diagram of another pixel circuit provided in the embodiments of the present disclosure.

Furthermore, as shown in FIG. 8, a pixel circuit provided in another embodiment of the present disclosure may further include a fourth switching transistor T4. It should be noted that the pixel circuit in the present embodiment except for the fourth switching transistor T4 is the same as that in the embodiment shown in FIG. 1.

Particularly, a gate of the fourth switching transistor T4 is connected to the scan line, a drain (a first electrode) of the fourth switching transistor T4 is connected to the drain (the first electrode) of the second switching transistor T2 and a source (a second electrode) of the fourth switching transistor T4 is connected to the drain (the first electrode) of the driving transistor DTFT; the fourth switching transistor T4 and the first switching transistor T1 are of the same type, that is, both are N-type TFTs or P-type TFTs. For the connection of the light-emitting device OLED, the driving transistor DTFT, the storage capacitor Cst, the first switching transistor T1, the second switching transistor T2, the compensating transistor T3 and the fifth switching transistor T5, please refer to the detail description for the embodiment shown in FIG. 1, and repeated description will be emitted.

Below, description will be given in detail to the operation process of the pixel circuit in the present embodiment in conjunction with FIG. 2, and FIGS. 8-10.

Under the timing sequence shown in FIG. 2, the operation process of the pixel circuit shown in FIG. 8 is divided into two stages as well.

A First Stage: Compensating Stage

In the compensating stage, the scan signal Vscan is at a high level and the control signal EM is at a low level, and the pixel circuit shown in FIG. 8 can be equivalent to the circuit structure shown in FIG. 9. Combining FIG. 8 and FIG. 9, the first switching transistor T1 and the fourth switching transistor T4 are N-type TFTs, and they are turned on as the scan signal Vscan input to the gates of the first switching transistor T1 and the fourth switching transistor T4 is at the high level. Meanwhile, the second switching transistor T2 and the fifth switching transistor T5 are also N-type TFTs, and are turned off as the control signal EM input to the gates of the second switching transistor T2 and the fifth switching transistor T5 is at the low level.

Particularly, when the fourth switching transistor T4 is turned on, the light-emitting device OLED is shorted by the fourth switching transistor T4 being on. Therefore, different from the embodiment shown in FIG. 1, in the present embodiment, no current flows through the light-emitting device OLED during this stage and the light-emitting device OLED does not emit light. When the first switching transistor T1 is turned on, the data signal Vdata is input to the gate of the driving transistor DTFT via the first switching transistor T1, and charges the storage capacitor Cst to make sure that the data signal Vdata input to the gate of the driving transistor DTFT is maintained.

After the completion of charging, a voltage VA at point A is the data signal Vdata, $$\text{that is, } VA=Vdata \qquad (9)$$

a voltage VB at point B is a value obtained by subtracting a threshold voltage Vth3 of the compensating transistor T3 from the power supply voltage VDD, $$\text{that is, } VB=VDD-Vth3 \qquad (10)$$

so, the voltage across the two plates of the storage capacitor Cst is:

$$\begin{aligned} VAB &= VA - VB \\ &= Vdata - (VDD - Vth3) \\ &= Vdata - VDD + Vth3 \end{aligned} \qquad (11)$$

At this time, the second switching transistor T2 disconnects the storage capacitor Cst from the power supply VDD due to the low level of the input control signal EM, so as to make sure that the compensating transistor T3 is forward conductive. The fifth switching transistor T5 disconnects the driving transistor DTFT from the ground GND due to the low level of the input control signal EM, so as to avoid the loss of the data signal Vdata input to the gate of the driving transistor DTFT via the connection between the fifth switching transistor T5 and the ground GND.

A Second Stage: A Stage for Switching to Light Emission

In the stage for switching to light emission, the scan signal Vscan is at a low level and the control signal EM is at a high level. At this time, the pixel circuit shown in FIG. 8 can be equivalent to that shown in FIG. 10.

Combining FIG. 8 and FIG. 10, the first switching transistor T1 is turned off due to the low level of the input scan signal Vscan, so that the gate of the driving transistor DTFT and the source of the first switching transistor T1 (i.e., the input terminal of the data signal Vdata) are separated from each other, and thus the driving transistor DTFT drives the light-emitting device OLED without being affected by the variation of the signal of the source of the first switching transistor T1. Meanwhile, the fourth switching transistor T4 is turned off due to the low level of the input scan signal Vscan, and the light-emitting device OLED is no longer shorted, so that the light-emitting device OLED is driven to emit light.

Meanwhile, the upper plate of the storage capacitor Cst is directly connected to the power supply VDD since the second switching transistor T2 is turned on due to the high level of the control signal EM, which makes the voltage VB at point B jump to VDD instantaneously. It can be known from the principles of physics, the voltage across the two plates of the storage capacitor Cst cannot change instantaneously, and thus the above equation (11) still stands when the voltage VB at point B just jumps to VDD. So, the voltage VA at point A equals to a sum of the voltage VB at point B and the voltage VAB across point A and point B, that is, $$\begin{aligned} VA &= VB + VAB \\ &= VDD + (Vdata - VDD + Vth3) \\ &= Vdata + Vth3 \end{aligned} \qquad (12)$$

Meanwhile, the source of the driving transistor DTFT is directly connected to the ground GND since the fifth switching transistor T5 is turned on due to the high level of the control signal EM. At this time, The driving transistor DTFT begins to drive the light-emitting device OLED to emit light. A gate-source voltage of the driving transistor DTFT is as follows:

$$Vgs=VA-0=Vdata+Vth3 \qquad (13)$$

According to the equations (5) and (13), in the present embodiment, the current flowing through the driving transistor DTFT is as follows:

$$I=K(Vdata+Vth3-Vth)^2 \qquad (14)$$

Similar to the principle of the previously described embodiments, when locations of the compensating transistor T3 and the driving transistor DTFT are close, the threshold voltage Vth3 of the compensating transistor T3 and the threshold voltage Vth of the driving transistor DTFT are almost the same, that is, Vth3−Vth=0. Then the equation (14) can be represented as:

$$I=K \cdot Vdata^2 \qquad (15)$$

wherein K has the same meaning as that in the previously described embodiments and can be considered as a constant herein. As such, the current flowing through the driving transistor DTFT only has a relation with the data signal Vdata and independent of the threshold voltage Vth of the driving transistor DTFT, which avoids the variation in the current flowing through the light-emitting device OLED caused by drift of the threshold voltage of the driving transistor DTFT due to manufacturing process of the back-board or long-time operation thereof, which effectively increases the evenness of the luminance of the light-emitting device OLED.

Moreover, in the present embodiment, the light-emitting device OLED is shorted by the fourth switching transistor T4 in the compensating stage, that is, no current flows through the light-emitting device OLED in the compensating stage and the light-emitting device OLED does not emit light, which avoids flicker of the light-emitting device OLED in the compensating stage.

It should be noted that, although description is given with taking OLED as an example in the present disclosure, the light-emitting device provided in the embodiments of the present disclosure may also be other light-emitting devices capable of being driven by the pixel circuit in the embodiments of the present disclosure, and thus is not limited in the present disclosure.

It should be noted that, in the present embodiment, description is given to the case where the fourth switching transistor T4 is added into the embodiment shown in FIG. 1, i.e., the embodiment wherein all of the respective TFTs are N-type TFTs, but the present disclosure is not limited thereto. In other embodiments of the present disclosure, part or all of the above respective N-type TFTs may be substituted by P-type TFTs, if only the following conditions are satisfied: the compensating transistor T3 and the driving transistor DTFT being TFTs of a same type, the fourth switching transistor T4 and the first switching transistor T1 being TFTs of a same type, and the second switching transistor T2 and the fifth switching transistor T5 being TFTs of a same type. Here, TFTs of a same type refers to TFTs of N-type or TFTs of P-type.

Corresponding to the previously described pixel circuit, as shown in FIG. 11, in embodiments of the present disclosure, there is provided a driving method of the pixel circuit including the steps of:

S11, turning on the first switching transistor T1 and meanwhile turning off the second switching transistor T2 and the fifth switching transistor T5, so that the data signal Vdata on the data line charges the first plate of the storage capacitor Cst via the first switching transistor T1 and the power supply VDD charges the second plate of the storage capacitor Cst via the light-emitting device OLED and the compensating transistor T3;

S12, turning off the first switching transistor T1 and meanwhile turning on the second switching transistor T2 and the fifth switching transistor T5, so that the light-emitting device OLED is driven to emit light by the current, supplied from the power supply VDD, flowing through the light-emitting device OLED, the driving transistor DTFT and the fifth switching transistor T5 in turn.

In the driving method of the pixel circuit provided in the embodiments of the present disclosure, the driving of the pixel circuit is divided into two stages by controlling the switching and the charging/discharging process of the circuit with the compensating transistor T3, the storage capacitor and a plurality of switching transistors, so that the driving current of the driving transistor DTFT is independent of the threshold voltage Vth of the driving transistor DTFT, which compensates the variation in the current flowing through the light-emitting device OLED caused by inconsistence or drift of the threshold voltage Vth of the driving transistor DTFT, and can effectively increase the evenness of the luminance of the light-emitting device OLED.

Meanwhile, the threshold voltage Voth of the light-emitting device such as OLED may be added to the voltage across the gate and the second electrode of the driving transistor DTFT in the stage for switching to light emission, which can compensates the variation in the current flowing through the light-emitting device OLED caused by the increase of the threshold voltage of the light-emitting device OLED.

It should be noted that, in the present embodiment, the light-emitting device is OLED, but the present disclosure is not limited thereto. The light-emitting device may also be other light-emitting devices capable of being driven by the pixel circuit provided in the embodiments of the present disclosure, and is not limited in the present disclosure.

Optionally, in one embodiment of the present disclosure, the first switching transistor T1, the second switching transistor T2 and the fifth switching transistor T5 are N-type TFTs, the first electrodes thereof are the drains and the second electrodes thereof are the sources. For the step S11, the driving method of the pixel circuit provided in the embodiments of the present disclosure can control the first switching transistor T1 to be turned on by inputting a high level through the scan line to the gate of the first switching transistor T1, and meanwhile control the second switching transistor T2 and the fifth switching transistor T5 to be turned off by inputting a low level through the control line to the gates of the second switching transistor T2 and the fifth switching transistor T5. Accordingly, for the step S12, the driving method of the pixel circuit provided in the embodiments of the present disclosure can control the first switching transistor T1 to be turned off by inputting a low level through the scan line to the gate of the first switching transistor T1, and meanwhile control the second switching transistor T2 and the fifth switching transistor T5 to be turned on by inputting a high level through the control line to the gates of the second switching transistor T2 and the fifth switching transistor T5.

Optionally, in another embodiment of the present disclosure, the first switching transistor T1 is an N-type TFT, the first electrode thereof is the drain and the second electrode thereof is the source; the second switching transistor T2 and the fifth switching transistor T5 are P-type TFTs, the first electrodes thereof are the sources and the second electrodes thereof are the drains. For the step S11, the driving method of the pixel circuit provided in the embodiments of the present disclosure can control the first switching transistor T1 to be turned on by inputting a high level through the scan line to the gate of the first switching transistor T1, and meanwhile control the second switching transistor T2 and the fifth switching transistor T5 to be turned off by inputting a high level through the control line to the gates of the second switching transistor T2 and the fifth switching transistor T5. Accordingly, for the step S12, the driving method of the pixel circuit provided in the embodiments of the present disclosure can control the first switching transistor T1 to be turned off by inputting a low level through the scan line to the gate of the first switching transistor T1, and meanwhile control the second switching transistor T2 and the fifth switching transistor T5 to be turned on by inputting a low level through the control line to the gates of the second switching transistor T2 and the fifth switching transistor T5.

Optionally, in another embodiment of the present disclosure, the first switching transistor T1 is a P-type TFT, the first electrode thereof is the source and the second electrode thereof is the drain; both the second switching transistor T2 and the fifth switching transistor T5 are N-type TFTs, the first electrodes thereof are the drains and the second electrodes thereof are the sources.

For the step S11, the driving method of the pixel circuit provided in the embodiments of the present disclosure can control the first switching transistor T1 to be turned on by inputting a low level through the scan line to the gate of the first switching transistor T1, and meanwhile control the second switching transistor T2 and the fifth switching transistor T5 to be turned off by inputting a low level through the control line to the gates of the second switching transistor T2 and the fifth switching transistor T5. Accordingly, for the step S12, the driving method of the pixel circuit provided in the embodiments of the present disclosure can control the first switching transistor T1 to be turned off by inputting a high level through the scan line to the gate of the first switching transistor T1, and meanwhile control the second switching transistor T2 and the fifth switching transistor T5 to be turned on by inputting a high level through the control line to the gates of the second switching transistor T2 and the fifth switching transistor T5.

Optionally, in another embodiment of the present disclosure, the first switching transistor T1, the second switching transistor T2 and the fifth switching transistor T5 are P-type TFTs. For the step S11, the driving method of the pixel circuit provided in the embodiments of the present disclosure can control the first switching transistor T1 to be turned on by inputting a low level through the scan line to the gate of the first switching transistor T1, and meanwhile control the second switching transistor T2 and the fifth switching transistor T5 to be turned off by inputting a high level through the control line to the gates of the second switching transistor T2 and the fifth switching transistor T5. Accordingly, for the step S12, the driving method of the pixel circuit provided in the embodiments of the present disclosure can control the first switching transistor T1 to be turned off by inputting a high level through the scan line to the gate of the first switching transistor T1, and meanwhile control the second switching transistor T2 and the fifth switching transistor T5 to be turned on by inputting a low level through the control line to the gates of the second switching transistor T2 and the fifth switching transistor T5.

Furthermore, in another embodiment of the present disclosure, in the step S11, turning on the first switching transistor T1 may further include turning on the first switching transistor T1 and the fourth switching transistor T4 simultaneously.

Particularly, in the step S11, turning on the first switching transistor T1 and the fourth switching transistor T4 simultaneously, and meanwhile turning off the second switching transistor T2 and the fifth switching transistor T5, makes the data line (i.e., the data line where the data signal Vdata is located) charge the first plate of the storage capacitor Cst via the first switching transistor T1 and the power supply VDD charge the second plate of the storage capacitor Cst via the fourth switching transistor T4 and the compensating transistor T3.

Accordingly, in the step S12, turning off the first switching transistor T1 may further include turning off the first switching transistor T1 and the fourth switching transistor 14 simultaneously. Particularly, in the step S12, turning off the first switching transistor T1 and the fourth switching transistor T4 simultaneously and meanwhile turning on the second switching transistor T2 and the fifth switching transistor T5, makes the light-emitting device OLED be driven to emit light by the current, supplied from the power supply VDD, flowing through the light-emitting device OLED, the driving transistor DTFT and the fifth switching transistor T5 in turn.

The gate of the fourth switching transistor T4 is connected to the scan line, the first electrode of the fourth switching transistor T4 is connected to the first electrode of the second switching transistor T2, and the second electrode of the fourth switching transistor T4 is connected to the first electrode of the driving transistor DTFT, and the fourth switching transistor T4 and the first switching transistor T1 are of the same type.

The fourth switching transistor T4 and the first switching transistor T1 are turned on or off simultaneously since they are controlled by the scan signal Vscan. In the present embodiment, for the principle and detailed process for turning on or off the fourth switching transistor T4 and the first switching transistor T1, please refer to the description of the previously described embodiments of the present disclosure, and repeated description will be emitted.

In the present embodiment, the light-emitting device OLED is shorted by the turned-on fourth switching transistor T4 in the compensating stage, that is, no current flows through the light-emitting device OLED in the compensating stage and the light-emitting device OLED does not emit light, which avoids flicker of the light-emitting device OLED in the compensating stage.

Accordingly, the present disclosure further provides a display apparatus including any of the pixel circuits provided in the previous embodiments and thus having the advantageous technical effect achieved by the pixel circuits provided by the embodiments of the present disclosure. The pixel circuits and the advantageous technical effect thereof have been explained above, and thus repeated description will be emitted.

Those skilled in the art can understand that all or part of steps in the above method/process embodiments can be implemented through hardware instructed by associated computer program. The associated computer program can be stored in a computer readable storage medium, and, when being executed, performs the steps of the above method/process embodiments. The storage medium can include any kind of medium capable of storing program codes such as ROM, RAM, magnetic disc, optical disc, etc.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure. The protection scope of the present disclosure should be defined by the attached claims.

What is claimed is:

1. A pixel circuit comprising:
   a light-emitting device, a driving transistor, a storage capacitor, a first switching transistor, a second switching transistor, a compensating transistor and a fifth switching transistor,
   wherein each of the driving transistor, the first switching transistor, the second switching transistor, the compensating transistor and the fifth switching transistor comprises a gate, a first electrode and a second electrode;
   one terminal of the light-emitting device is connected to a power supply;
   the first electrode of the driving transistor is connected to another terminal of the light-emitting device, the second electrode of the driving transistor is connected to the first electrode of the fifth switching transistor, and the gate of the driving transistor is connected to the first electrode of the first switching transistor;
   the second electrode of the first switching transistor is connected to a data line, the gate of the first switching transistor is connected to a scan line, and the first electrode of the first switching transistor is connected to the gate of the driving transistor;
   the gate of the second switching transistor is connected to a control line, the first electrode of the second switching transistor is connected to the power supply, and the second electrode of the second switching transistor is connected to the second electrode of the compensating transistor;
   the first electrode of the compensating transistor is connected to the first electrode of the driving transistor, the second electrode of the compensating transistor is connected to the second electrode of the second switching transistor, and the gate of the compensating transistor is connected to the first or second electrode of the compensating transistor;
   the gate of the fifth switching transistor is connected to the control line, the first electrode of the fifth switching transistor is connected to the second electrode of the driving transistor, and the second electrode of the fifth switching transistor is connected to ground; and
   a first plate of the storage capacitor is connected to the gate of the driving transistor, and a second plate of the storage capacitor is connected to the second electrode of the compensating transistor.

2. The pixel circuit according to claim 1, further comprising: a fourth switching transistor, wherein a gate of the fourth switching transistor is connected to the scan line, a first electrode of the fourth switching transistor is connected to the first electrode of the second switching transistor and a second electrode of the fourth switching transistor is connected to the first electrode of the driving transistor,
wherein the fourth switching transistor and the first switching transistor are of the same type.

3. The pixel circuit according to claim 1, wherein
the driving transistor and the compensating transistor are N-type Thin Film Transistors (TFTs), the first electrodes of the driving transistor and the compensating transistor are the drains and the second electrodes of the driving transistor and the compensating transistor are the sources; and the gate and the first electrode of the compensating transistor are connected to each other; or
the driving transistor and the compensating transistor are P-type TFTs, the first electrodes of the driving transistor and the compensating transistor are the sources and the second electrodes of the driving transistor and the compensating transistor are the drains; and the gate and the second electrode of the compensating transistor are connected to each other.

4. The pixel circuit according to claim 1, wherein
the second switching transistor and the fifth switching transistor are N-type TFTs, the first electrodes of the second switching transistor and the fifth switching transistor are the drains and the second electrodes of the second switching transistor and the fifth switching transistor are the sources; or
the second switching transistor and the fifth switching transistor are P-type TFTs, the first electrodes of the second switching transistor and the fifth switching transistor are the sources and the second electrodes of the second switching transistor and the fifth switching transistor are the drains.

5. The pixel circuit according to claim 1, wherein
the first switching transistor is an N-type TFT, the first electrode of the first switching transistor is the drain and the second electrode of the first switching transistor is the source; or
the first switching transistor is a P-type TFT, the first electrode of the first switching transistor is the source and the second electrode of the first switching transistor is the drain.

6. The pixel circuit according to claim 1, wherein the light-emitting device is an Organic Light-Emitting Diode.

7. A method comprising providing a pixel circuit having a light-emitting device, a driving transistor, a storage capacitor, a first switching transistor, a second switching transistor, a compensating transistor, a fourth switching transistor and a fifth switching transistor, wherein each of the driving transistor, the first switching transistor, the second switching transistor, the compensating transistor, the fourth switching transistor and the fifth switching transistor comprises a gate, a first electrode and a second electrode; one terminal of the light-emitting device is connected to a power supply; the first electrode of the driving transistor is connected to another terminal of the light-emitting device, the second electrode of the driving transistor is connected to the first electrode of the fifth switching transistor, and the gate of the driving transistor is connected to the first electrode of the first switching transistor; the second electrode of the first switching transistor is connected to a data line, the gate of the first switching transistor is connected to a scan line, and the first electrode of the first switching transistor is connected to the gate of the driving transistor; the gate of the second switching transistor is connected to a control line, the first electrode of the second switching transistor is connected to the power supply, and the second electrode of the second switching transistor is connected to the second electrode of the compensating transistor;
the first electrode of the compensating transistor is connected to the first electrode of the driving transistor, the second electrode of the compensating transistor is connected to the second electrode of the second switching transistor, and the gate of the compensating transistor is connected to the first or second electrode of the compensating transistor; the gate of the fifth switching transistor is connected to the control line, the first electrode of the fifth switching transistor is connected to the second electrode of the driving transistor, and the second electrode of the fifth switching transistor is connected to ground; the gate of the fourth switching transistor is connected to the scan line, the first electrode of the fourth switching transistor is connected to the first electrode of the second switching transistor, and the second electrode of the fourth switching transistor is connected to the first electrode of the driving transistor; a first plate of the storage capacitor is connected to the gate of the driving transistor, and a second plate of the storage capacitor is connected to the second electrode of the compensating transistor;
turning on the first switching transistor and meanwhile turning off the second switching transistor and the fifth switching transistor, so that the data signal on the data line charges the first plate of the storage capacitor via the first switching transistor and the power supply charges the second plate of the storage capacitor via the light-emitting device and the compensating transistor; and
turning off the first switching transistor and meanwhile turning on the second switching transistor and the fifth switching transistor, so that the light-emitting device is driven to emit light by the current, supplied from the power supply, flowing through the light-emitting device, the driving transistor and the fifth switching transistor in turn.

8. The method according to claim 7, wherein
the step of turning on the first switching transistor and meanwhile turning off the second switching transistor and the fifth switching transistor, so that the data signal on the data line charges the first plate of the storage capacitor via the first switching transistor and the power supply charges the second plate of the storage capacitor via the light-emitting device and the compensating transistor comprises:
turning on the first switching transistor and the fourth switching transistor simultaneously and meanwhile turning off the second switching transistor and the fifth switching transistor, so that the data line charges the first plate of the storage capacitor via the first switching transistor and the power supply charges the second plate of the storage capacitor via the fourth switching transistor and the compensating transistor; and
the step of turning off the first switching transistor and meanwhile turning on the second switching transistor and the fifth switching transistor, so that the light-emitting device is driven to emit light by the current, supplied from the power supply, flowing through the light-emitting device, the driving transistor and the fifth switching transistor in turn comprises:
turning off the first switching transistor and the fourth switching transistor simultaneously and meanwhile turning on the second switching transistor and the fifth switching transistor, so that the light-emitting device is driven to emit light by the current, supplied from the power supply, flowing through the light-emitting device, the driving transistor and the fifth switching transistor in turn,
wherein a gate of the fourth switching transistor is connected to the scan line, a first electrode of the fourth switching transistor is connected to the first electrode of the second switching transistor and a second electrode of the fourth switching transistor is connected to the first electrode of the driving transistor,
wherein the fourth switching transistor and the first switching transistor are of the same type.

9. The method according to claim 7, wherein
the first switching transistor is an N-type Thin Film Transistor (TFT), the first electrode of the first switching transistor is the drain and the second electrode of the first switching transistor is the source;
the second switching transistor and the fifth switching transistor are N-type TFTs, the first electrodes of the second switching transistor and the fifth switching transistor are the drains and the second electrodes of the second switching transistor and the fifth switching transistor are the sources;
wherein the step of turning on the first switching transistor and meanwhile turning off the second switching transistor and the fifth switching transistor comprises:
turning on the first switching transistor by inputting a high level through the scan line to the gate of the first switching transistor, and meanwhile turning off the second switching transistor and the fifth switching transistor by inputting a low level through the control line to the gates of the second switching transistor and the fifth switching transistor;
wherein the step of turning off the first switching transistor and meanwhile turning on the second switching transistor and the fifth switching transistor comprises:
turning off the first switching transistor by inputting a low level through the scan line to the gate of the first switching transistor, and meanwhile turning on the second switching transistor and the fifth switching transistor by inputting a high level through the control line to the gates of the second switching transistor and the fifth switching transistor.

10. The method according to claim 7, wherein
the first switching transistor is an N-type Thin Film Transistor TFT, the first electrode of the first switching transistor is the drain and the second electrode of the first switching transistor is the source;
the second switching transistor and the fifth switching transistor are P-type TFTs, the first electrodes of the second switching transistor and the fifth switching transistor are the sources and the second electrodes of the second switching transistor and the fifth switching transistor are the drains;
wherein the step of turning on the first switching transistor and meanwhile turning off the second switching transistor and the fifth switching transistor comprises:
turning on the first switching transistor by inputting a high level through the scan line to the gate of the first switching transistor, and meanwhile turning off the second switching transistor and the fifth switching transistor by inputting a high level through the control line to the gates of the second switching transistor and the fifth switching transistor;
wherein the step of turning off the first switching transistor and meanwhile turning on the second switching transistor and the fifth switching transistor comprises:
turning off the first switching transistor by inputting a low level through the scan line to the gate of the first switching transistor, and meanwhile turning on the second switching transistor and the fifth switching transistor by inputting a low level through the control line to the gates of the second switching transistor and the fifth switching transistor.

11. The method according to claim 7, wherein
the first switching transistor is a P-type Thin Film Transistor TFT, the first electrode of the first switching transistor is the source and the second electrode of the first switching transistor is the drain;
the second switching transistor and the fifth switching transistor are N-type TFTs, the first electrodes of the second switching transistor and the fifth switching transistor are the drains and the second electrodes of the second switching transistor and the fifth switching transistor are the sources;
wherein the step of turning on the first switching transistor and meanwhile turning off the second switching transistor and the fifth switching transistor comprises:
turning on the first switching transistor by inputting a low level through the scan line to the gate of the first switching transistor, and meanwhile turning off the second switching transistor and the fifth switching transistor by inputting a low level through the control line to the gates of the second switching transistor and the fifth switching transistor;
wherein the step of turning off the first switching transistor and meanwhile turning on the second switching transistor and the fifth switching transistor comprises:
turning off the first switching transistor by inputting a high level through the scan line to the gate of the first switching transistor, and meanwhile turning on the second switching transistor and the fifth switching transistor by inputting a high level through the control line to the gates of the second switching transistor and the fifth switching transistor.

12. The method according to claim 7, wherein
the first switching transistor is a P-type Thin Film Transistor (TFT), the first electrode of the first switching transistor is the source and the second electrode of the first switching transistor is the drain;
the second switching transistor and the fifth switching transistor are P-type TFTs, the first electrodes of the second switching transistor and the fifth switching transistor are the sources and the second electrodes of the second switching transistor and the fifth switching transistor are the drains;
wherein the step of turning on the first switching transistor and meanwhile turning off the second switching transistor and the fifth switching transistor comprises:
turning on the first switching transistor by inputting a low level through the scan line to the gate of the first switching transistor, and meanwhile turning off the second switching transistor and the fifth switching transistor by inputting a high level through the control line to the gates of the second switching transistor and the fifth switching transistor;
wherein the step of turning off the first switching transistor and meanwhile turning on the second switching transistor and the fifth switching transistor comprises:
turning off the first switching transistor by inputting a high level through the scan line to the gate of the first switching transistor, and meanwhile turning on the second switching transistor and the fifth switching transistor by inputting a low level through the control line to the gates of the second switching transistor and the fifth switching transistor.

13. A display apparatus comprising a pixel circuit having a light-emitting device, a driving transistor, a storage capacitor, a first switching transistor, a second switching transistor, a compensating transistor, a fourth switching transistor and a fifth switching transistor, wherein each of the driving transistor, the first switching transistor, the second switching transistor, the compensating transistor, the fourth switching transistor and the fifth switching transistor comprises a gate, a first electrode and a second electrode; one terminal of the light-emitting device is connected to a power supply; the first electrode of the driving transistor is connected to another terminal of the light-emitting device, the second electrode of the driving transistor is connected to the first electrode of the fifth switching transistor, and the gate of the driving transistor is connected to the first electrode of the first switching transistor; the second electrode of the first switching transistor is connected to a data line, the gate of the first switching transistor is connected to a scan line, and the first electrode of the first switching transistor is connected to the gate of the driving transistor; the gate of the second switching transistor is connected to a control line, the first electrode of the second switching transistor is connected to the power supply, and the second electrode of the second switching transistor is connected to the second electrode of the compensating transistor; the first electrode of the compensating transistor is connected to the first electrode of the driving transistor, the second electrode of the compensating transistor is connected to the second electrode of the second switching transistor, and the gate of the compensating transistor is connected to the first or second electrode of the compensating transistor; the gate of the fifth switching transistor is connected to the control line, the first electrode of the fifth switching transistor is connected to the second electrode of the driving transistor, and the second electrode of the fifth switching transistor is connected to ground; the gate of the fourth switching transistor is connected to the scan line, the first electrode of the fourth switching transistor is connected to the first electrode of the second switching transistor, and the second electrode of the fourth switching transistor is connected to the first electrode of the driving transistor; a first plate of the storage capacitor is connected to the gate of the driving transistor, and a second plate of the storage capacitor is connected to the second electrode of the compensating transistor.

\* \* \* \* \*